United States Patent
McLellan

(10) Patent No.: US 12,550,722 B2
(45) Date of Patent: Feb. 10, 2026

(54) PROTECTING CIRCUITRY UNDER LASER PROGRAMMABLE FUSES

(71) Applicant: II-VI Delaware, Inc., Wilmington, DE (US)

(72) Inventor: Scott W. McLellan, Kempton, PA (US)

(73) Assignee: II-VI DELAWARE, INC., Wilmington, DE (US)

( * ) Notice: Subject to any disclaimer, the term of this patent is extended or adjusted under 35 U.S.C. 154(b) by 570 days.

(21) Appl. No.: 17/821,294

(22) Filed: Aug. 22, 2022

(65) Prior Publication Data

US 2024/0063117 A1 Feb. 22, 2024

(51) Int. Cl.
*H01L 23/525* (2006.01)
*H01L 23/532* (2006.01)

(52) U.S. Cl.
CPC .... *H01L 23/5258* (2013.01); *H01L 23/53295* (2013.01)

(58) Field of Classification Search
CPC .................................................. H01L 23/5258
USPC ............................................................ 257/209
See application file for complete search history.

(56) References Cited

U.S. PATENT DOCUMENTS

| | | | |
|---|---|---|---|
| 4,228,428 A | 10/1980 | Niedermeyer | |
| 4,228,528 A | 10/1980 | Cenker et al. | |
| 4,827,325 A | 5/1989 | Or-Bach et al. | |
| 4,853,758 A | 8/1989 | Fischer | |
| 5,025,300 A | 6/1991 | Billig et al. | |
| 5,986,319 A | 11/1999 | Huggins | |
| 6,297,541 B1 | 10/2001 | Ema et al. | |
| 6,323,067 B1 | 11/2001 | Ning | |
| 6,420,216 B1* | 7/2002 | Clevenger | H01L 23/5258 257/E23.15 |
| 2005/0236688 A1 | 10/2005 | Bang et al. | |
| 2007/0076642 A1 | 4/2007 | Chien et al. | |
| 2007/0102786 A1* | 5/2007 | Ido | H01L 23/5258 257/E23.15 |
| 2007/0120232 A1 | 5/2007 | Greco et al. | |
| 2007/0172995 A1 | 7/2007 | Choi | |
| 2008/0194064 A1 | 8/2008 | Badami et al. | |
| 2017/0316989 A1* | 11/2017 | Tsai | G01R 31/28 |
| 2022/0102583 A1* | 3/2022 | Baumheinrich | G02B 6/105 |

FOREIGN PATENT DOCUMENTS

WO 0188981 A1 11/2001

* cited by examiner

*Primary Examiner* — Ajay Arora
(74) *Attorney, Agent, or Firm* — Blank Rome LLP

(57) ABSTRACT

An integrated circuit has fuses that are selectively configurable by laser light having a wavelength incident on the fuses. A substrate of the integrated circuit has circuitry thereon. Fuses are disposed vertically above at least a portion of the circuitry. A dielectric reflector is disposed vertically above and laterally covers at least a portion of the circuitry. The dielectric reflector has a plurality of alternating dielectric layers of different refractive indices and is disposed adjacent to the fuses. The dielectric reflector is configured to reflect at least a portion of the laser light at the wavelength incident thereto.

9 Claims, 3 Drawing Sheets

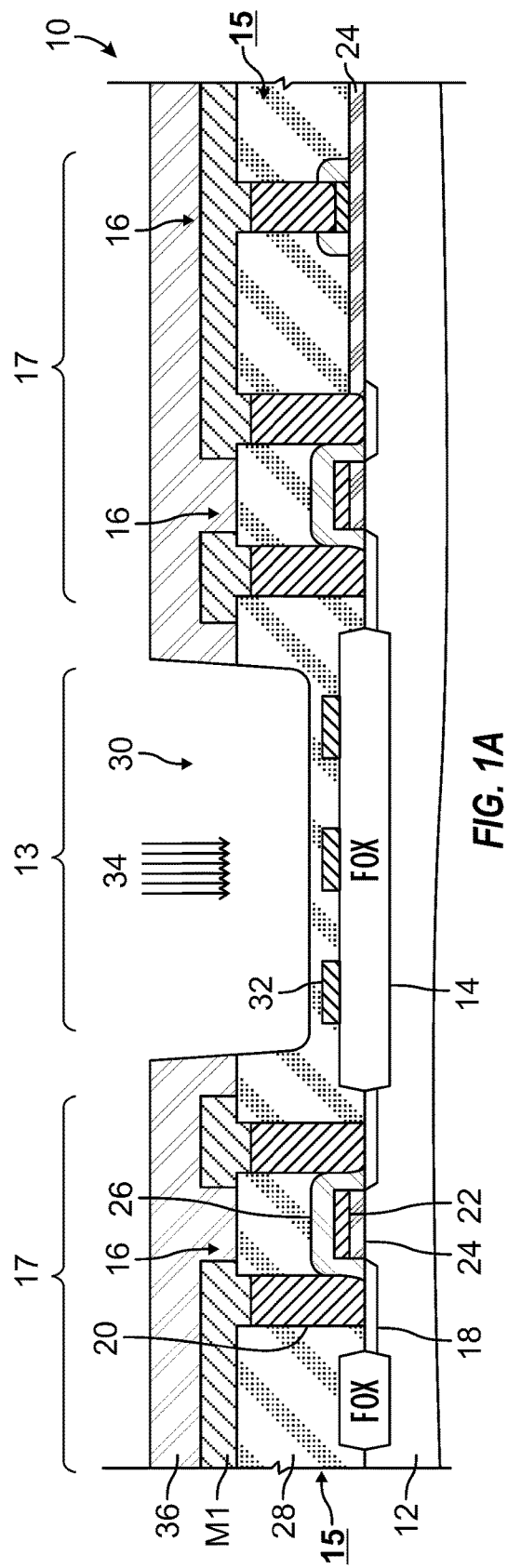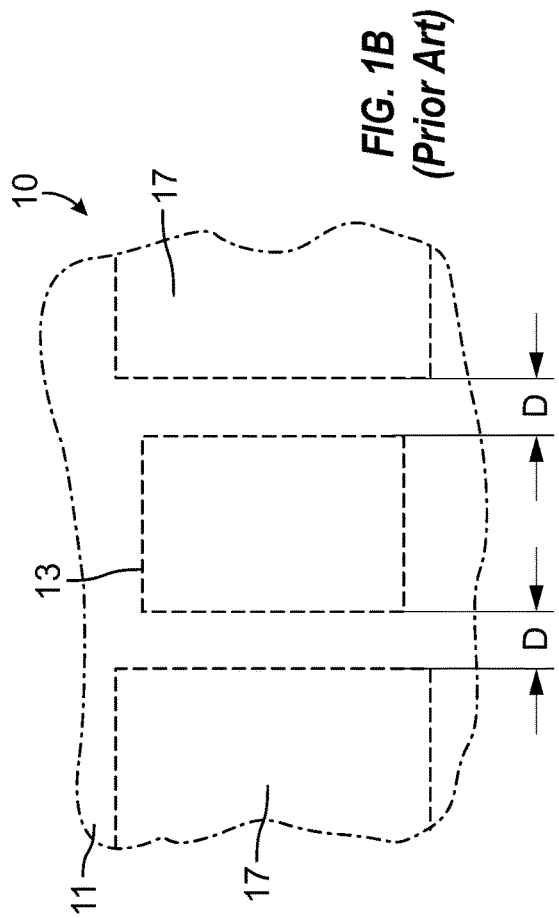
FIG. 1A (Prior Art)
FIG. 1B (Prior Art)

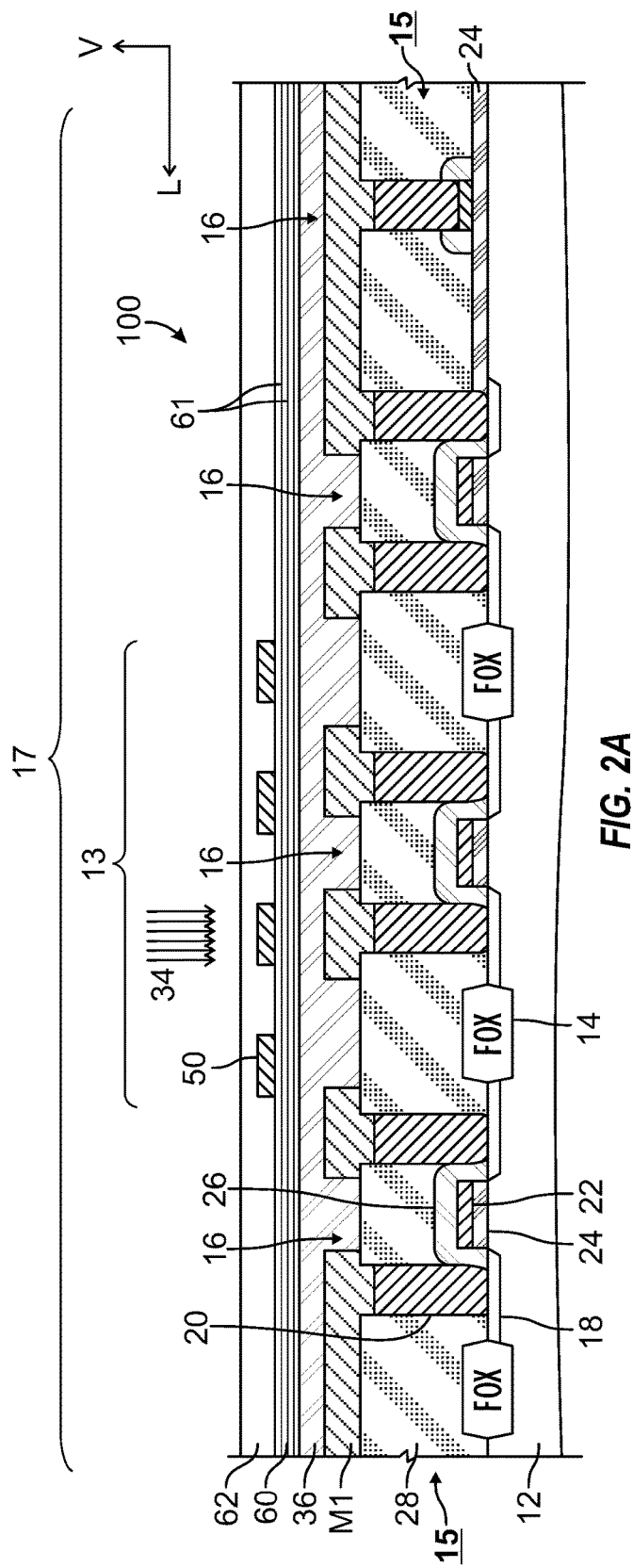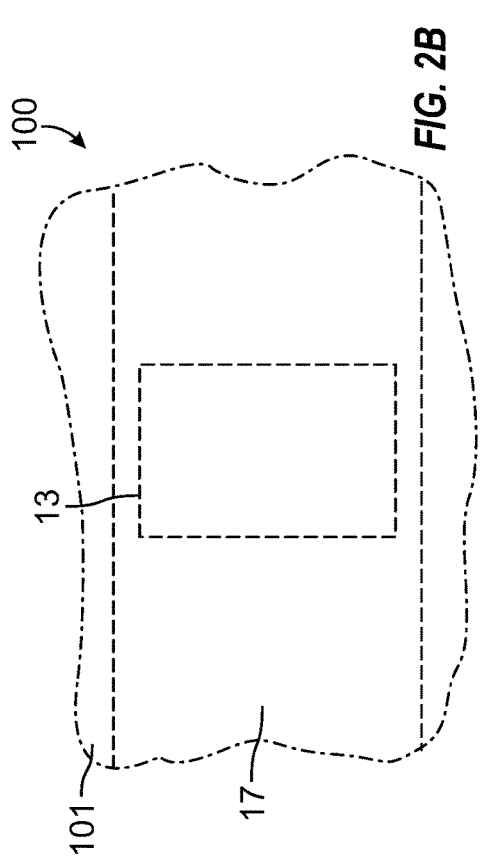
FIG. 2A
FIG. 2B

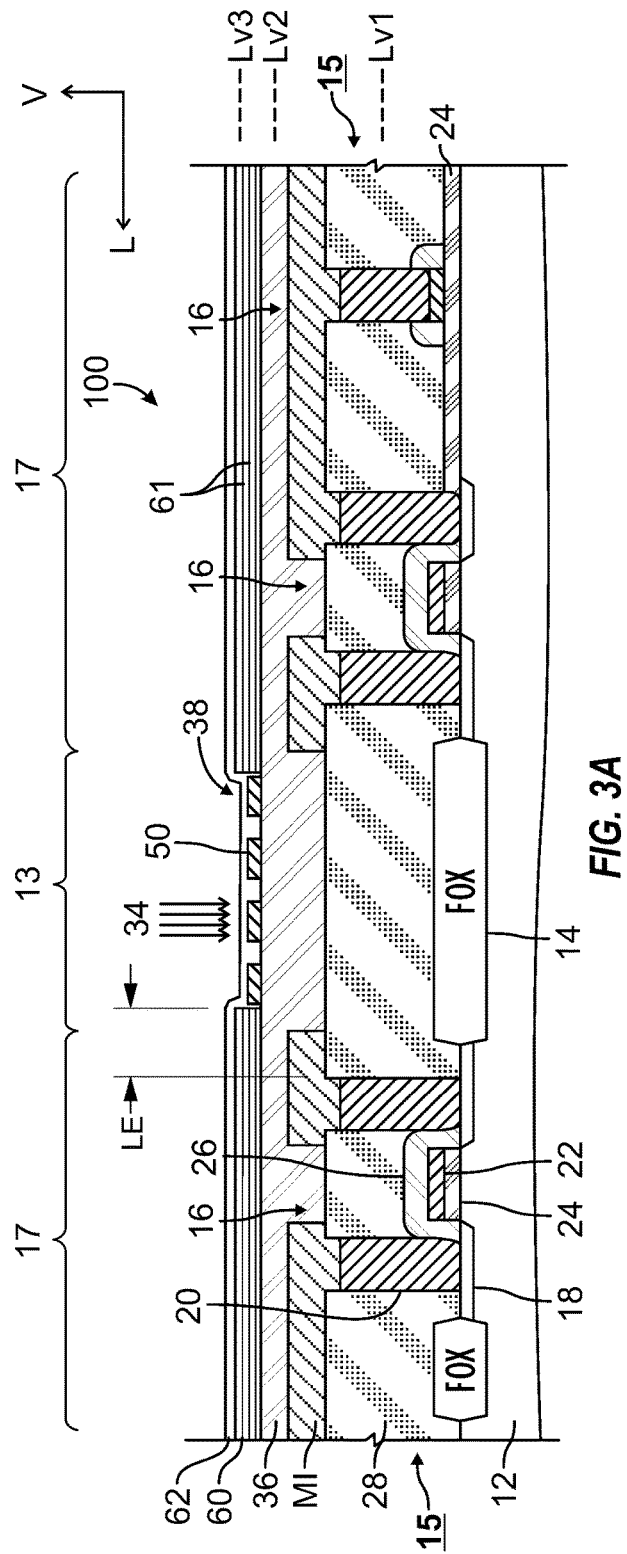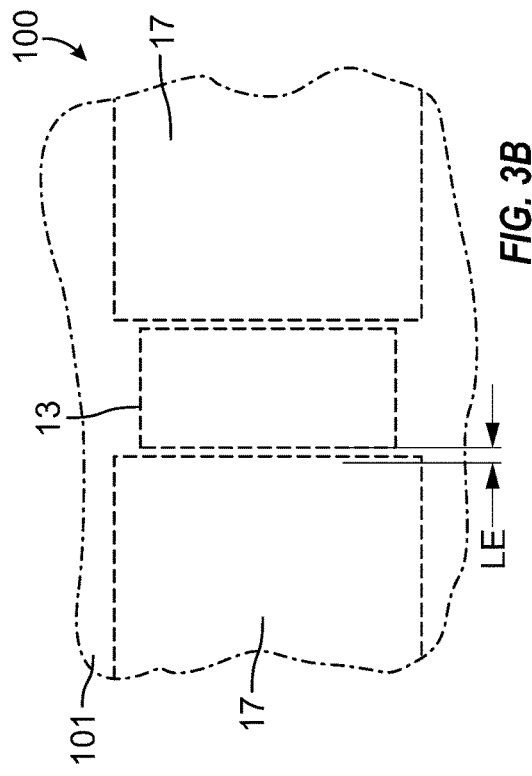
FIG. 3A
FIG. 3B

PROTECTING CIRCUITRY UNDER LASER PROGRAMMABLE FUSES

BACKGROUND OF THE DISCLOSURE

Programmable fuses are used in a wide variety of integrated circuits to provide memory cell redundancy, indicate serial numbering, enable on-chip functions, and the like. The programmable fuse is made of polysilicon or metal, and a laser is used to selectively render the programmable fuse nonconductive. Because any structures arranged below or near the programmed fuse can be damaged by the laser during programming, circuitry for the chip is typically not present under the fuses and is spaced laterally therefrom. This leaves real estate on the chip unused.

For example, FIG. 1A illustrates a simplified cross-sectional view of a typical prior art integrated circuit 10 having a substrate 12 and circuitry 15 in regions 17 that includes exemplary transistors 16, such as those used in memory cells. The substrate 12 is usually composed of silicon, and each transistor 16 typically includes a silicided source/drain region 18, tungsten plugs 20, a silicided polysilicon gate 22, and a gate oxide layer 24. A dielectric spacer 26 surrounds the gate 22 and the gate oxide 24 of each transistor 16. A planarized dielectric layer 28 overlies the transistor 16 and supports the tungsten plugs 20.

The tungsten plugs 20 connect metal interconnect conductors M1 to the respective source/drain regions 18 of the transistors 16. Field oxide (FOX) isolation regions 14 are arranged between the transistors 16 to electrically isolate the transistors from each other. Overlying the conductors M1 and dielectric layer 28 is a second planarized dielectric layer 36.

To give the integrated circuit 10 the functionality offered by laser-programmable fuses, an opening 30 is formed in the integrated circuit 10 to form a fuse region 13. The programmable fuses 32 are disposed in the opening 30 over one of the field oxide (FOX) regions 14. The opening 30 is formed by removing a portion of the dielectric layer 36 and then thinning the dielectric layer 28 over the fuses 32.

The programmable fuses 32 are either heavily doped polysilicon, or they are thinned metal, such as that used for the M1 conductors. As noted previously, the fuses 32 are selectively rendered nonconductive using laser light 34.

As already noted, circuitry, such as the transistors 16, can be damaged if exposed to the laser light 34 during fuse programming. In fact, a significant portion of the laser light 34 can reach the FOX region 14. Therefore, circuitry is not placed below the fuses 32 to avoid damage. For this reason and as diagrammed in the plan view of FIG. 1B, the prior art integrated circuit 10 has a layout 11 in which a fuse region 13 (having fuses) is laterally offset from circuit regions 17 (having circuitry 15 such as transistors 16 and/or conductors such as M1). The spacing D helps protect the circuitry 15 in circuit regions 17 from laser light due to spillover or misalignment of the laser light 34 when the fuses are being programmed. Thus, the fuse region 13 and the spacing D takes up considerable space in the integrated circuit's layout 11, and this space cannot be used for other circuitry.

The subject matter of the present disclosure is directed to overcoming, or at least reducing the effects of, one or more of the problems set forth above.

SUMMARY OF THE DISCLOSURE

An integrated circuit disclosed herein is configurable by laser light. The integrated circuit comprises a substrate, circuitry, a plurality of fuses, and a dielectric reflector. The circuitry is disposed on the substrate. The fuses are disposed adjacent to the circuitry, and each of the fuses is selectively programmable in response to the laser light incident thereto. The dielectric reflector is disposed adjacent to the fuses and the circuitry. The dielectric reflector has a plurality of alternating high and low refractive index dielectric layers configured to reflect at least a portion of the laser light incident thereto away from the circuitry adjacent to the dielectric reflector.

A method is disclosed herein for manufacturing an integrated circuit that is configurable by laser light. The method comprises: forming circuitry on a substrate; forming a plurality of fuses adjacent to the circuitry and configuring each of the fuses to be selectively programmable in response to the laser light incident thereto; and forming a dielectric reflector adjacent to the fuses and the circuitry by forming a plurality of alternating high and low refractive index dielectric layers and configuring the dielectric layers to reflect at least a portion of the laser light incident thereto away from the circuitry.

In one configuration of the integrated circuit and method, the dielectric reflector can be disposed vertically above and laterally over at least a portion of the circuitry, and the fuses can be disposed vertically above the dielectric reflector such that they too are located over a portion of the circuitry. In another configuration, the fuses can be disposed on a planarized dielectric layer so the fuses are vertically above and at least laterally adjacent to the circuitry. The dielectric reflector can be disposed on the planarized dielectric layer laterally adjacent to the fuses, which are exposed in exposed areas in the dielectric reflector.

The foregoing summary is not intended to summarize each potential embodiment or every aspect of the present disclosure.

BRIEF DESCRIPTION OF THE DRAWINGS

FIG. 1A illustrates a cross-sectional view of an integrated circuit according to the prior art having exemplary transistors and programmable fuses.

FIG. 1B diagrams in a plan view a layout of representative regions for an integrated circuit according to the prior art.

FIG. 2A illustrates a cross-sectional view of an integrated circuit according to the present disclosure having exemplary transistors and programmable fuses.

FIG. 2B diagrams in a plan view a layout of representative regions for an integrated circuit according to FIG. 2A.

FIG. 3A illustrates a cross-sectional view of another integrated circuit according to the present disclosure having exemplary transistors and programmable fuses.

FIG. 3B diagrams in a plan view a layout of representative regions for an integrated circuit according to FIG. 3A.

DETAILED DESCRIPTION OF THE DISCLOSURE

According to the present disclosure, a dielectric reflector having high reflectance is added under and/or adjacent to programmable fuses on an integrated circuit to protect any circuitry present below and/or adjacent to the fuses. The dielectric reflector protects the circuitry from laser light used to ablate or evaporate the fuses during programming by reflecting at least a portion of the laser light away from the circuitry. The laser light reflected by the dielectric reflector can also advantageously reduce the light fluence needed to program the fuses.

FIG. 2A illustrates an example of an integrated circuit 100. For ease of explanation, FIG. 2A illustrates a cross-sectional view of the integrated circuit 100 having layers comparable to those discussed above with reference to FIG. 1A. As will be appreciated, the teachings disclosed herein can be used in integrated circuits of any other type or configuration.

Again, the integrated circuit 100 has a substrate 12 typically composed of silicon and has a fuse region 13 and circuit regions 17 disposed on the substrate 12. The circuit regions 17 have circuitry 15 that includes exemplary transistors 16, which can be used in memory cells. In this example, the transistors 16 have a conventional field-effect transistor (FET) structure, which uses a semiconductor channel (not shown) having drain and sources electrodes 18 at either end and which uses a gate electrode 22 near the channel to control the conductivity of the channel. Although transistors 16 having the conventional FET structure are shown, the teachings of the present disclosure can be used with fin-shaped field-effect transistor (FINFET) structures and bipolar transistor structures as well. Moreover, other than transistors, the circuitry 15 can include other forms of circuitry, including electrical interconnects, other semiconductor devices, passive devices (e.g., resistors and capacitors), and the like.

In the present example and similar to the previous discussion, each transistor 16 includes a silicided source/drain region 18, tungsten plugs 20, a silicided polysilicon gate 22, and a gate oxide layer 24. Dielectric spacers 26 surround the gate 22 and the gate oxide layer 24. These dielectric spacers 26, typically of silicon nitride, provide gate sidewall spacers to separate the tungsten plugs 20 from the gate 22 and acts as a contaminant barrier. A planarized dielectric layer 28 is provided that separates the metal layer M1 from the transistors 16 and is typically a low-k material deposited by plasma-enhanced chemical vapor deposition (PECVD). The tungsten plugs 20, formed in the dielectric layer 28, connect metal interconnect conductors M1 (which alternatively can be formed using a damascene process) to the respective source/drain regions 18. Field oxide (FOX) isolation regions 14 are arranged between the transistors 16 to electrically isolate the transistors from each other. Alternatively, shallow trench isolation (STI) can be used instead of FOX for isolation. Overlying the conductors M1 and the dielectric layer 28 is a planarized dielectric layer 36, also typically a low-k dielectric.

Here, a fuse region 13 having a plurality of programmable fuses 50 is disposed vertically (in a vertical direction V) above a portion of the circuitry 15 in regions 17 (e.g., one or more transistors 16). Each of the programmable fuses 50 is selectively programmable in response to exposure to laser light 34 incident thereto. Again, the programmable fuses 50 are either heavily doped polysilicon, or they are thinned metal, such as used for the M1 conductors. In general, the fuse 50 can be composed of a material with electrical resistance or conductivity that can be changed in response to exposure from the laser light 34 directed at the fuse 50.

For some arrangements of the integrated circuit 100, the programmable fuses 50 can be metal interconnects arranged in electrical communication with circuitry 15. As one example, the integrated circuit 100 can be a semiconductor chip having memory circuitry in regions 17 that includes memory cells (not shown) arranged in an array of rows and columns. Each memory cell has at least one transistor 16 therein along with electrical interconnections between the memory cells. The programmable fuses 50 can be used to disconnect rows or columns of cells having defective memory cells from the array so that spare rows or columns of memory cells can be substituted, such as that taught in U.S. Pat. No. 4,228,428 (Cenker).

In a default condition, the fuses 50 are electrically conductive and complete an electric circuit path between the interconnected elements. When a selected one of the fuses 50 is exposed to the laser light 34, the fuse 50 is ablated, evaporated, or the like, which breaks the electric circuit path. In this way, the electrical paths of the integrated circuit 100 can be selectively configured and programmed. Alternatively, the fuses 50 can be "anti-fuses," which are by default essentially non-conductive and are then made conductive using a laser.

To protect the circuitry 15 (e.g., transistors 16) in the region 17 below the fuse region 13, a dielectric reflector 60 is disposed between the fuses 50 and the circuitry. In the arrangement of FIG. 2A, the dielectric reflector 60 is disposed vertically above (in the vertical direction V) and laterally over (in a lateral direction L) a least a portion of the circuitry 15. The fuses 50 are disposed vertically above the dielectric reflector 60. Thus, the fuses 50 are disposed vertically above and laterally over a portion of the circuitry 15 such that the dielectric reflector 60 is positioned between the fuses 50 and the circuitry 15 in regions 17.

In this example, the dielectric reflector 60 is shown disposed on a planarized dielectric layer 36 of the integrated circuit 100, but there may be other intermediate dielectric layers (not shown) between this layer 36 and the dielectric reflector 60. Moreover, the fuses 50 are shown disposed on the dielectric reflector 60 in this example, but there may be additional dielectric layers (not shown) between the fuses 50 and the dielectric reflector 60, and these additional layers (not shown) can be substantially transparent to the laser light 34 used to program the fuses 50. Finally, a protective layer 62 (typically silicon oxynitride), and possibly other dielectric layers, can also be formed over the reflector 60 and/or fuses 50 before or after laser programming.

The dielectric reflector 60 is composed of layers 61 of alternating high and low refractive index dielectric material. The dielectric layers 61 essentially do not absorb the laser light 34 incident on them. In fact, the alternating dielectric layers 61 are not intended to absorb the laser light 34, and the layers 61 are not intended to generate heat to affect the fuses 50. Instead, the number, thicknesses, and composition of the alternating dielectric layers 61 results in the dielectric reflector 60 acting as a reflector tuned to the particular wavelength (or wavelength range) of the laser light 34 used to program the fuses 50. In this way, the reflector 60 can reflect at least a portion of the laser light 34 at the respective wavelength away from the circuitry 15 in region 17. Moreover, the reflector 60 reflects at least a portion of the laser light 34 back toward the fuse 50 in the direction of the laser source (not shown).

The alternating dielectric layers 61 can be formed using known deposition techniques. In general, about ten to twenty alternating dielectric layers 61 may be sufficient to provide approximately 60% or more reflectivity to the laser light 34 that impinges essentially perpendicular to the dielectric reflector 60. Exemplary materials for the alternating dielectric layers 61 of the dielectric reflector 60 include silica ($SiO_2$) for a low index material, and hydrogenated silicon (Si:H), tantalum pentoxide ($Ta_2O_5$), titanium oxide ($TiO_2$), niobium pentoxide ($Nb_2O_5$), or mixtures thereof for the high refractive index material.

The number and thicknesses of the alternating dielectric layers 61 can be adjusted to obtain a desired reflectivity depending on the refractive indexes of the layers 61 and the wavelength of the laser light 34 used to program the fuses 50. Ultimately, the number of the dielectric layers 61, the thickness of the dielectric layers 61, and the high and low refractive indices of the dielectric layers 61 configure the dielectric reflector 60 as a reflector tuned to the wavelength (or wavelength range) of the laser light 34 used, which in this embodiment can be a wavelength of approximately one micron. The thicknesses of the layers 61 can be of different thicknesses, i.e., some high refractive index layers 61 can be thicker than other layers; the same goes for low refractive index layers 61. Further, the number of high and low refractive index layers can be different, i.e., there might be more high or low refractive index layers than there are low or high refractive index layers, respectively. Still further, the composition, and thus the refractive index, of each of the layers 61 in the reflector 60 can vary so that there can be more than one type or refractive index for the high index layers and similarly for the low index layers.

The lateral extent of the dielectric reflector 60 (in the lateral direction L) away from the fuse region 13 can be configured as needed to protect the circuitry 15 in region 17 from the laser light 34. In this isolated view of the integrated circuit 100 as a whole, the dielectric reflector 60 is depicted as extending entirely across the circuit regions 17, well beyond the fuse region 13 of the fuses 50. The dielectric reflector 60 can provide more or less lateral coverage for a given implementation and may extend over the entirety of the integrated circuit 100. In fact, the dielectric reflector 60 can be made up of a continuous portion or one or more discrete portions arranged at a level in the integrated circuit 100 between a lower level having the circuitry 15 therein and an upper level having the fuses 50.

The laser light 34 reflected from the dielectric reflector 60 back to a targeted fuse 50 can increase the amount of laser light 34 that interacts with the targeted fuse 50. In this way, lower laser light fluence (e.g., using lower laser light power and/or less laser dwell time on each fuse 50) can be used to program the fuses 50 compared to prior art techniques. Finally, because the dielectric reflector 60 protects the area below the dielectric reflector 60 from any significant laser light 34 that could cause unintended damage, circuitry 15 can be placed vertically below the fuse region 13, which overlaps portions of the circuit region 17.

For instance, FIG. 2B diagrams a plan view of a layout 101 for the integrated circuit 100. As will be appreciated, this layout 101 is simplified. The layout 101 shows how the fuse region 13 (having fuses) laterally covers a portion of circuit region 17 so that more of the available space on the substrate can be used compared to that shown in FIG. 1A.

In the previous example, the dielectric reflector 60 is disposed between the transistors 16 and the fuses 50—i.e., the dielectric reflector 60 is disposed at a level in the integrated circuit 100 that is above the level of the circuitry 15 and below the level of the fuses 50. For another arrangement, FIG. 3A illustrates another integrated circuit 100 having a dielectric reflector 60 according to the present disclosure. For ease of explanation, the integrated circuit 100 has layers comparable to those discussed with reference to FIGS. 1A and 2A.

Again, the integrated circuit 100 has a substrate 12 and circuit regions 17 with exemplary transistors 16 is disposed on the substrate 12. The substrate 12 is typically composed of silicon, and field oxide (FOX) isolation regions are arranged between the transistors 16. The structures of the transistors 16 shown here are similar to those discussed previously.

As before, a fuse region 13 having a plurality of fuses 50 is disposed at a level vertically above (in the vertical direction V) a portion of the circuitry 15 (e.g., transistors 16). Each of the fuses 50 is selectively programmable in response to exposure to laser light 34 incident thereto.

To protect the circuitry 15 in regions 17 adjacent to the fuse region 13, a dielectric reflector 60 is disposed adjacent to the fuses 50. In the arrangement in FIG. 3A, the dielectric reflector 60 is disposed vertically above (in a vertical direction V) and laterally adjacent (in a lateral direction L) at least a portion of the circuitry 15 in regions 17. The fuses 50 are disposed in one or more exposed areas 38 of the integrated circuit 100, and the dielectric reflector 60 is disposed laterally next to the exposed areas 38 having the fuses 50.

In this arrangement, a dielectric layer 36 is formed vertically above the circuitry 15 and is planarized. The fuses 50 are formed on the planarized dielectric layer 36. The dielectric reflector 60 is formed on the planarized dielectric layer 36 and on the fuses 50 as described above. The dielectric reflector 60 is then patterned to form exposed areas 38. This is typically done by photolithographically defining an etch-resistant mask of photoresist (not shown) on the reflector 60 to leave behind the mask where the reflector 60 is to remain on the integrated circuit 100. The unmasked reflector is then etched to remove the unwanted layers 61 the mask does not cover, thereby exposing the fuses 50 as shown, and then the mask is removed. This results in the dielectric reflector 60 being adjacent to the fuses 50 located in the exposed area 38. Finally, a protective layer 62 (typically silicon oxynitride) can also be formed over the dielectric reflector 60 and/or the fuses 50.

In this example, the fuses 50 are disposed on the dielectric layer 36, as opposed to being disposed on the reflector 60 as in FIG. 2A. Accordingly, the circuitry 15 in region 17 is disposed at a first level LV1, the fuses 50 are disposed at a second level LV2 vertically above the first level LV1, and the dielectric reflector 60 is disposed at a third level LV3 that is essentially the same as the second level LV2. Depending on the manufacturing process used to fabricate the integrated circuit 100, the levels LV2, LV3 for the fuses 50 and dielectric reflector 60 can be close to one another or can be about the same.

In general and as noted previously, the dielectric reflector 60 can be disposed on the planarized dielectric layer 36, but there may be other intermediate dielectric layers (not shown) between the fuses 50 and this dielectric layer 36. Composition and fabrication of the dielectric reflector 60 are the same as described above in connection with FIG. 2A so the details are incorporated here but not repeated.

The lateral extent of the dielectric reflector 60 (in the lateral direction L) over the circuit region 17 can be configured as needed to protect the circuitry 15 from the laser light 34. In this isolated view, the dielectric reflector 60 extends entirely across the circuit region 17, well beyond the region 13 of the fuses 50, except for the one or more exposed areas 38. The dielectric reflector 60 can provide more or less lateral coverage for a given implementation than shown as desired.

In this configuration, the dielectric reflector 60 isolates the lateral extent of the laser light 34 that is applied to the fuses 50. In this way, the dielectric reflector 60 can protect areas adjacent to the fuse region 13 from any significant laser light 34 that could cause unintended damage. The area directly beneath the fuses 50 is not protected from laser light 34 so circuitry should not be placed directly below the fuses 50. However, the circuitry 15 in region 17 can be placed closer in lateral extent (LE) to the area below the fuse region 13 than possible without the reflector 60 present.

For instance, FIG. 3B diagrams a plan view of a layout 101 for the integrated circuit 100. As will be appreciated, this layout 101 is simplified. The layout 101 has a fuse region 13 (having fuses) that is laterally closer in lateral extent (LE) to circuit regions 17, which allows more of the substrate 12 to be used for circuitry than the prior art approach of FIG. 1A.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter. For example, the reflector 60 of FIG. 2A placed below the fuses 50 can be combined with the exposed areas 38 and the reflector 60 of FIG. 3A to produce a hybrid configuration.

What is claimed is:

1. An integrated circuit being configurable by laser light, the integrated circuit comprising:
   a substrate;
   circuitry disposed on the substrate;
   a plurality of fuses disposed adjacent to the circuitry, each of the fuses being selectively programmable in response to the laser light incident thereto;
   a dielectric reflector disposed adjacent to the fuses and the circuitry, the dielectric reflector having a plurality of alternating high and low refractive index dielectric layers configured to reflect at least a portion of the laser light incident thereto away from the circuitry adjacent to the dielectric reflector; and
   a planarized dielectric layer disposed on the circuitry, wherein the dielectric reflector is disposed on the planarized dielectric layer and has one or more openings therein to expose areas of the planarized dielectric layer, and wherein the fuses are disposed on the planarized dielectric layer in the one or more exposed areas of the dielectric reflector,
   wherein, the fuses are disposed vertically above and laterally adjacent to the circuitry; and the dielectric reflector is disposed laterally adjacent to the fuses.

2. The integrated circuit of claim 1, wherein the dielectric reflector is disposed laterally over and vertically above at least a portion of the circuitry.

3. The integrated circuit of claim 1, further comprising a protective layer disposed on the dielectric reflector and/or the fuses.

4. The integrated circuit of claim 1, wherein the low index of refraction dielectric layers include silica ($SiO_2$); and wherein the high refractive index layers include at least one of hydrogenated silicon (Si:H), tantalum pentoxide ($Ta_2O_5$), titanium oxide ($TiO_2$), and niobium pentoxide ($Nb_2O_5$).

5. The integrated circuit of claim 1, wherein a number of the dielectric layers, thicknesses of the high and low refractive indices dielectric layers, and the high and low refractive indices for the dielectric layers configure the dielectric reflector as a reflective filter tuned to a wavelength or range of wavelengths of the laser light.

6. The integrated circuit of claim 1, wherein the fuses are doped polysilicon or a metal.

7. The integrated circuit of claim 1, wherein the circuitry includes at least one of: an electrical interconnect, a semiconductor device, a passive device, and a memory cell.

8. The integrated circuit of claim 1, wherein the dielectric reflector includes at least 10 of the alternating high and low refractive index dielectric layers.

9. The integrated circuit of claim 8, wherein the dielectric reflector is configured to reflect at least 60% of the laser light incident thereto away from the semi-conductor device.

* * * * *